(12) United States Patent
Stanley

(10) Patent No.: US 6,683,494 B2
(45) Date of Patent: Jan. 27, 2004

(54) DIGITAL SIGNAL PROCESSOR ENHANCED PULSE WIDTH MODULATION AMPLIFIER

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 10/106,544

(22) Filed: Mar. 26, 2002

(65) Prior Publication Data

US 2002/0167354 A1 Nov. 14, 2002

Related U.S. Application Data

(60) Provisional application No. 60/278,780, filed on Mar. 26, 2001.

(51) Int. Cl.[7] .............................................. H03F 3/38
(52) U.S. Cl. .................... 330/10; 330/207 A; 375/238
(58) Field of Search ............................. 330/10, 207 A, 330/251; 375/238; 327/243, 316

(56) References Cited

U.S. PATENT DOCUMENTS

| | | | |
|---|---|---|---|
| 4,113,983 A | 9/1978 | Steel | |
| 4,709,391 A | 11/1987 | Kaizer et al. | |
| 4,926,302 A | 5/1990 | Harada et al. | |
| 5,111,378 A | 5/1992 | Nowak et al. | |
| 5,113,145 A | 5/1992 | Ideler et al. | |
| 5,438,625 A | 8/1995 | Klippel | |
| 5,528,695 A | 6/1996 | Klippel | |
| 5,559,467 A | 9/1996 | Smedley | |
| 5,577,126 A | 11/1996 | Klippel | |
| 5,657,219 A | 8/1997 | Stanley | |
| 5,694,476 A | 12/1997 | Klippel | |
| 5,708,433 A | 1/1998 | Craven | |
| 5,784,017 A | 7/1998 | Craven | |
| 5,815,585 A | 9/1998 | Klippel | |
| 5,923,144 A * | 7/1999 | Seibel et al. ................. | 318/805 |
| 6,031,481 A | 2/2000 | Craven | |
| 6,052,252 A * | 4/2000 | Kim ......................... | 360/78.09 |

OTHER PUBLICATIONS

Gerald R. Stanley and Kenneth M. Bradshaw, "Precision DC–to–AC Power Conversion by Optimization of the Output Current Waveform—The Half Bridge Revisited," *IEEE Transactions on Power Electronics*, vol. 14, No. 2, Mar. 1999.

Dr. M. Sandler, "Towards a Digital Power Amplifier," Presented at the 76th Convention of Audio Engineering Society, Oct. 8–11, 1984.

Mark Sandler, Jason Goldberg, Roderick, Hiorns, Robert Bowman, Michael Watson and Peter Ziman, "Ultra Low Distortion Digital Power Amplification," *Presented at the 91st Convention of Audio Engineering Society*, Oct. 4–8, 1991.

Peter Craven, "Toward the 24–bit DAC: Novel Noise–Shaping Topologies Incorporating Correction for the Nonlinearity in a PWM Output Stage," *J. Audio Eng. Soc.*, vol. 41, No. 5, May 1993.

(List continued on next page.)

*Primary Examiner*—Henry Choe
(74) *Attorney, Agent, or Firm*—Brinks Hofer Gilson & Lione (57) ABSTRACT

A pulse width modulator (PWM) audio power amplifier with a switch mode power converter is provided that may adjust the duty of the switch mode power converter based on output current. The PWM audio power amplifier may include a digital signal processor to process an input signal and control the switch mode power converter to minimize distortion in an amplified output signal. The control within the PWM audio power amplifier may include digital feed forward open loop control or may combine digital feed forward open loop control with analog negative feedback closed loop control to minimize distortion in the output signal.

38 Claims, 4 Drawing Sheets

OTHER PUBLICATIONS

Smedley, K.M., "Digital–PWM audio power amplifiers with noise and ripple shaping", Power Electronics Specialists Conference, PESC '94 Record., $25^{th}$ Annual IEEE Taipei, Taiwan Jun. 20–25, 1994, New York, NY, USA, IEEE, pp. 566–570 X–010121199.

Smith K.M. et al., "Realization of a digital PWM power amplifier using noise and ripple shaping", Power Electronics Specialists Conference, 1995. PESC '95 Record, $26^{th}$ Annual IEEE Atlanta, GA, USA Jun. 18–22, 1995, New York, NY, USA, IEEE, US, pp. 96–102 XP010150544.

Takano H., et al., "Multiple–bridge PWM current–regulated power amplifier for magnetic resonance imaging system and its feasible digital control implementation", Industrial Electronics Society, 1999. IECON '99 Proceedings. The $25^{th}$ Annual Conference of the IEEE San Jose, CA, USA Nov. 29–Dec. 3, 1999, Piscataway, NJ, USA, IEEE, US, pp. 785–790 XP010366646.

Himmelstoss, F.A. et al, "Compensated class–D amplifier as high quality AC–voltage source", Power Electronics and Drive System, 1999. PEDS '99. Proceedings of the IEEE 1999 International Conference on Hong Kong Jul. 2–29, 1999, Piscataway, NJ, USA, IEEE, US, pp. 116–120 XP010352055.

Watanabe, S. et al., "DSP–based high precision current tracking control of gradient coil in two–paralleled PWM amplifiers for MRI systems", Power Electronics Specialists Conference, 1998. PESC '98 Redord. $29^{th}$ Annual IEEE Fukuoka, Japan May 17–22, 1998, New York, NY, USA, IEEE, US, pp. 916–921 XP010294962.

\* cited by examiner

DIGITAL SIGNAL PROCESSOR ENHANCED PULSE WIDTH MODULATION AMPLIFIER

This application claims the benefit pursuant to 35 U.S.C. §119(e) of Provisional U.S. Patent Application Serial No. 60/278,780, filed on Mar. 26, 2001.

BACKGROUND OF THE INVENTION

1. Technical Field

This invention generally relates to pulse width modulation (PWM) amplifiers and, more particularly, to incorporation of digital signal processing (DSP) into PWM audio power amplifiers.

2. Related Art

Analog pulse width modulation (PWM) for audio applications has been prevalent since the days of vacuum tubes. In recent years, the integration of digital signal processors (DSPs) or other digital modulators with a PWM stage for conversion from digital to analog has become increasingly popular. Typically, DSPs are used to directly control the pulse widths of the output power stage(s) as described by, for example, "Ultra Low Distortion Digital Power Amplification," Mark Sandler, Jason Goldberg, Roderick Hiorns, Robert Bowman, Michael Watson, Peter Ziman, $91^{st}$ AES Convention Preprint 3115(Y-3), October 1991 and U.S. Pat. No. 5,548,526 to Craven.

Although the application of DSPs to digitally control the formation of PWM provides significant benefits, limitations are also present in known approaches. For example, the pulse width of the output pulses is quantized based on multiples of a controlling clock period. As such, resulting granularity or coarseness otherwise present in the output is typically reduced by noise-shaping methods relying on timers to statistically decrease the quantizing error, as described by, for example, "Toward the 24-bit DAC: Novel Noise-Shaping Topologies Incorporating Correction for the Nonlinearity in the PWM Output Stage," Peter Craven, Journal of the AES, Vol. 41 No.5, May 1993. Noise-shaping methods, however, may introduce noise into the output which greatly increases the out-of-band noise and somewhat increases the in-band noise.

In digital control of a PWM stage, the ability to effectively apply negative feedback to the power output stage is greatly reduced by latencies due to conversion of analog output signals to digital data and latencies in the subsequent numeric processing of the feedback signal. The ability to bound high-frequency output noise requires that the amount of high-frequency feedback be maximized. Any attempt to digitize a feedback signal results in added delays or phase lags in the fed back signals and adversely affect the bounding of the high-frequency output noise. To add to the bounding difficulty, the noise floor of A/D converters is often required to be at least 120 dB below full scale, else it becomes the limitation to the output noise performance.

Known approaches to implementing feedback with PWM output audio signals require that the PWM modulation spectra be largely removed from any signal that would attempt comparison to the input signal. If this is not done in these approaches, the use of feedback may actually increase the distortion levels over and above distortion levels found in open-loop PWM audio power amplifiers. As a consequence, digitally modulated PWM designs typically control with open-loop feed-forward corrections. Unfortunately, none of these approaches offer any hope of improving the random noise floor created by jitter in the gate drive and power circuits required to implement a feed-forward circuit.

A PWM output stage has total sensitivity to the voltage on its power supplies. For a feed-forward controlled PWM output stage this either requires precise regulation of the power supplies and/or feedback using fast A/D conversion of the power supply voltage to the digital modulator to minimize distortion. Although helpful in minimizing distortion, regulated power supplies are significantly more costly than non-regulated supplies. In addition, a low-latency A/D converter typically includes more analog circuitry than in a conventional analog PWM modulator. As such, the desire to remove analog circuitry through the use of the digital modulator actually increases the amount of analog circuitry in the system.

The output noise levels of any amplifier are at their lowest when there is little or no input signal. PWM amplifiers are no exception. Even with little or no input signal, however, PWM amplifiers may still exhibit output noise levels due to very small amounts of timing jitter in the PWM signal capable of producing large effective output signals. The higher the rail voltage (e.g. the bigger the amplifier) the more pronounced the jitter may become. The jitter noise in the output is the sum of both audio frequency jitter in the input signal as well as intermodulation terms from higher frequencies that may enter the PWM signal or modulation process.

Although prior art combinations of a DSP and a PWM output stages provides adequate performance and sufficiently low distortion for many non-critical applications, the above-described limitations become more significant in high fidelity applications. In such demanding applications, the noise performance of PWM power amplifiers is often marginal and additional noise is not tolerable. In addition, computations involved in digital PWM renderings detract from the ability to perform other computations with the DSP that may be useful in fidelity improvements. For demanding applications the noise and distortion imperfections of the power stage may require more exacting control than is possible with known approaches. Accordingly, there is a need for a PWM output stage for high fidelity applications capable of compensating for distortion by overcoming the previously described limitations.

SUMMARY

This invention provides a pulse width modulated (PWM) audio power amplifier capable of minimizing distortion and optimizing fidelity in demanding high fidelity audio applications. The PWM audio power amplifier may include an interleaved power output stage cooperatively operating with a digital signal processor (DSP). Utilizing the combination of the signal processing capability of the DSP and the capability of the interleaved output stage to operate with a total switching duty of greater than unity, distortion and other noise may be minimized. In addition, substantially unregulated power supplies may be utilized without excessive distortion.

In one embodiment, the PWM audio power amplifier includes a power digital to analog converter (DAC) and a DSP. The DSP operates with feed forward control along a fully digital signal path to drive the power DAC based on an input signal. Digital control signals may be provided by the DSP along a fully digital signal path to an opposed current amplifier (OCA) included within the power DAC to convert uniformly sampled input signals to a continuous equivalent waveform. The digital control signals may be independently processed by the DSP to independently control the switching duty of output stage switches included in the OCA. Feed forward control of the switching duty may include consideration of the output voltages and currents of the converter as well as power supply control voltages to minimize distortion while optimizing efficiency.

In another embodiment, the PWM audio power amplifier includes a power DAC, a feedback control circuit and a DSP. The PWM audio power amplifier of this embodiment is a hybrid design taking advantage of the strengths in the digital domain as well as those in the analog domain. The power DAC in cooperative operation with the feedback control circuit performs analog signal processing that includes high frequency negative feedback control to minimize error in the output signal. The feedback control loop may include consideration of the voltage and current of the output signal as well power supply control voltage. In addition, the DSP 18 may perform digital signal processing of the input signal along with fully digital feed forward control to inject a feed forward error correction into the feedback control loop. As such, the entire VI output plane over the range of load impedance of the transducer 12 may be compensated for distortion, thereby providing a low-noise and low distortion output signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Embodiments of a pulse width modulation (PWM) power amplifier suitable for use in high fidelity audio applications are disclosed. The PWM power amplifier provides high fidelity signal processing that minimizes noise and distortion while providing adequate levels of amplification of input signals.

Figure 1:
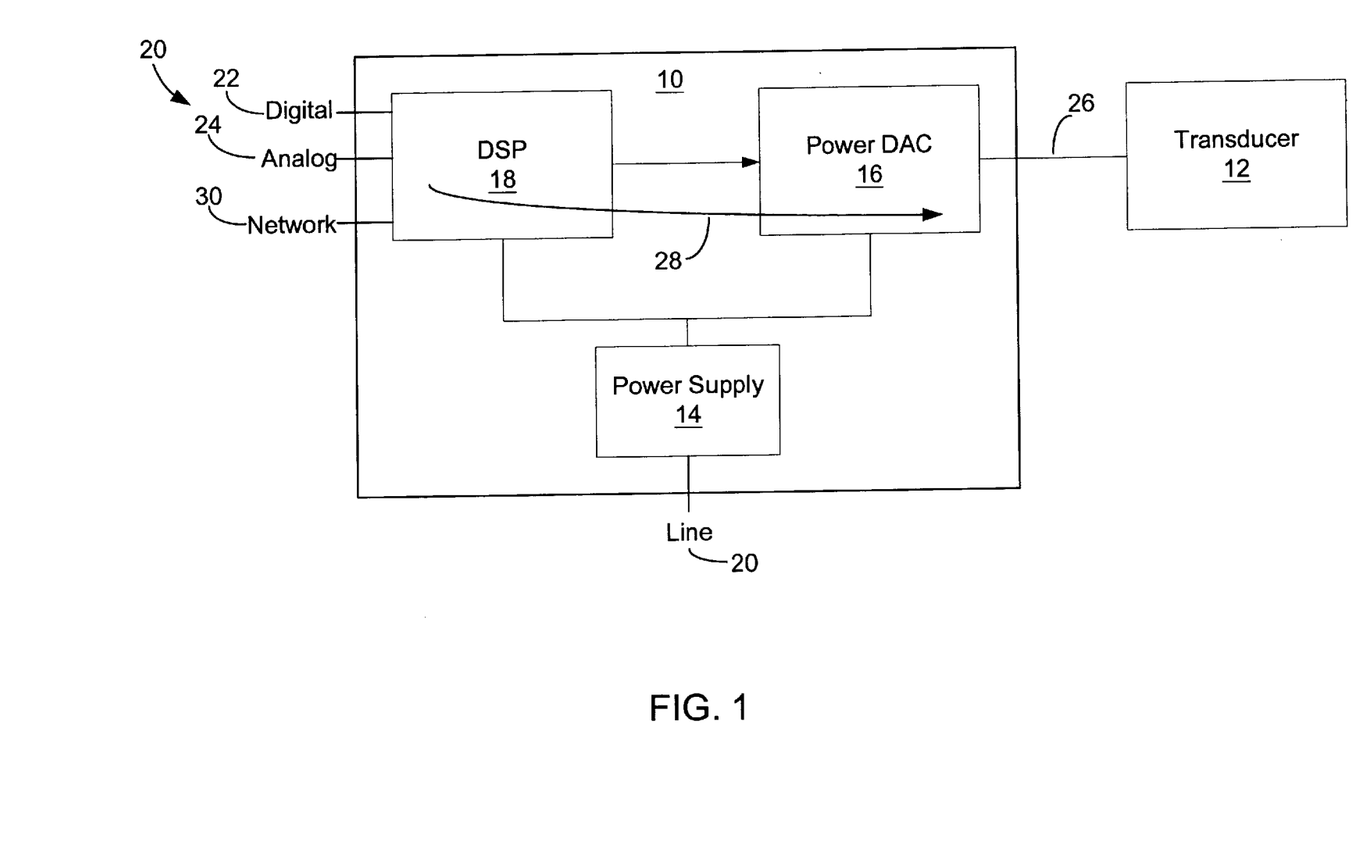
FIG. 1 is a block diagram of one embodiment of a pulse width modulated (PWM) audio power amplifier electrically coupled with a transducer.

FIG. 1 is a block diagram of one embodiment of a pulse width modulation (PWM) audio power amplifier 10. The PWM audio power amplifier 10 preferably operates using double edge analog PWM modulation with optimized feedback to drive at least one electrically connected transducer 12. The transducer 12 may be an audio output transducer, such as, for example, a loudspeaker, being driven by an output signal from the PWM audio power amplifier 10 to produce audible sound. In one embodiment, the PWM audio power amplifier 10 may be associated with a particular transducer 12. Accordingly, the operation of the PWM audio power amplifier 10 may be optimized for low noise and low distortion based on the load and operational characteristics of the transducer 12. In other embodiments, configuration of the PWM audio power amplifier 10 may be optimized for a class of transducers 12, a product line of transducers 12 or any other predefined grouping.

In the illustrated embodiment, the PWM audio power amplifier 10 includes a power supply 14, a power digital-to-analog converter (DAC) 16 and a digital signal processor (DSP) 18 electrically coupled as illustrated. As used herein, the term "coupled", "connected", or "interconnected" may mean electrically coupled, optically coupled, wirelessly coupled and/or any other form of coupling providing an interface between systems, devices and/or components.

The power supply 14 is operable to convert a line voltage present on a voltage supply line 20 to direct current (DC) voltage of a desired magnitude(s) to energize the DSP 18 and the power DAC 16. In the presently preferred embodiments, the power supply 14 is a substantially unregulated power supply to increase cost effectiveness. As known in the art, voltages of a substantially unregulated power supply may fluctuate based on fluctuation of the line voltage. Unregulated power supplies may be utilized since sensitivity to power supply fluctuations are accounted for by other mechanisms within the PWM audio power amplifier 10 as described later.

The power DAC 16 is the output stage of the PWM audio power amplifier 10 and may be used to drive the transducer 12. In the presently preferred embodiments, the power DAC 16 includes an interleaved half bridge design that operates to drive the transducer 12 based on digital control signals provided by the DSP 18. The DSP 18 may be any processor capable of logically processing analog or digital signals and providing digital control signals to the power DAC 16. An exemplary DSP is available from Motorola in the 56K family.

In the illustrated embodiment, the DSP 18 is capable of receiving an input signal on a digital input signal line 22 or at least one analog input signal line 24. Processing within the DSP 18 and the power DAC 16 to amplify the input signal and provide an output signal in analog form may be performed along a digital signal path as generally illustrated by arrow 28. The output signal provided on an output signal line 26 may be an amplified analog representation of the input signal.

The DSP 18 may also include a network connection 30. The network connection 30 may allow remote control and monitoring of the PWM audio power amplifier 10 over a network. The network may include a local area network (LAN), a wide area network (WAN), an intranet, an extranet, a proprietary network, the Internet and/or any other form of network configuration to enable transfer of data and commands. Communication within the network may be performed with a communication medium that includes wireline based communication systems and/or wireless based communication systems. The communication medium may be for example, a communication channel, radio waves, microwave, wire transmissions, fiber optic transmissions, or any other communication medium capable of transmitting data.

Figure 2:
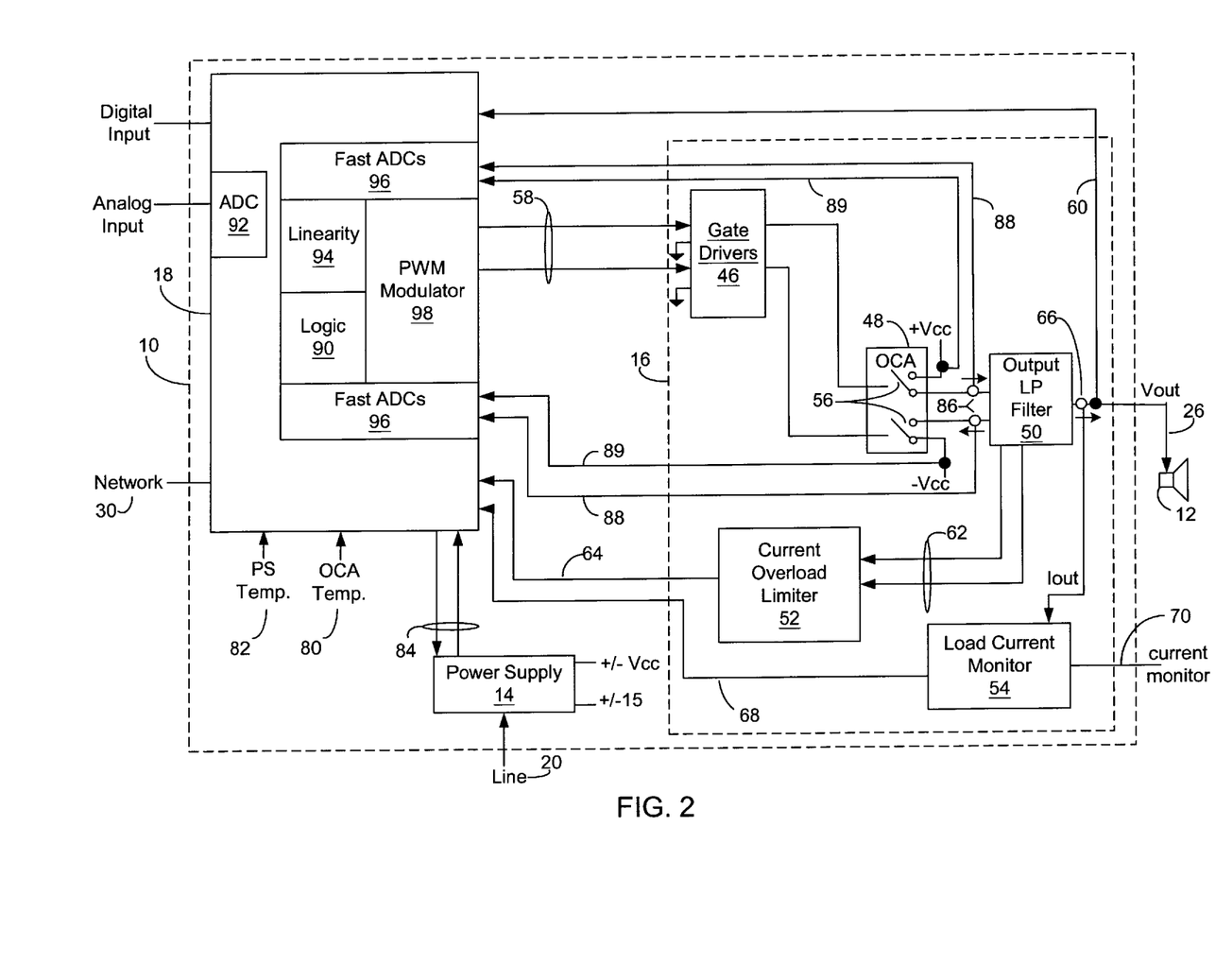
FIG. 2 is an expanded block diagram of one embodiment of the PWM audio power amplifier illustrated in FIG. 1.

FIG. 2 is a more detailed block diagram of the PWM audio power amplifier 10 illustrated in FIG. 1 that is electrically coupled with the transducer 12. The power DAC 16 includes gate drivers 46, an opposed current amplifier (OCA) 48, an output low pass (LP) filter 50, a current overload limiter 52 and a load current monitor 54 electrically coupled as illustrated. In addition, the DSP 18 includes a logic component 90, an analog-to-digital converter (ADC) component 92, a linearity component 94, a plurality of fast analog-to-digital converters (ADCs) 96 and a PWM modulator component 98 cooperatively operating as illustrated. Further, the power supply 14 may be electrically coupled with the DSP 18 and the OCA 48.

The power supply 14 is illustrated as a single substantially unregulated power supply however; in alternate embodiments multiple power supplies may be used. Further, the power supply(s) may be regulated in other embodiments. In the presently preferred embodiments, the power supply 14 generates a positive predetermined control voltage (+Vcc), a negative predetermined control voltage (−Vcc) and a +/−15 volt DC output from the line voltage. As known in the art, the magnitudes and quantities of voltage inputs and outputs of a power supply are design considerations, and may be varied accordingly.

The power DAC 16 provides an optimum output stage using an interleaved power stage design. Management of the interleaved power stage implies that twice as much PWM pulse shaping is performed over and above the doubling of computations required by a single double-edge modulation process. The gate drivers 46 control output stage switches 56 within the OCA 48 based on digital signals output from the DSP 18 on logic signal lines 58. In the illustrated embodiment, first and second output stage switches are depicted. The first and second output stage switches are representative of the positive and negative output stages. In other embodiments, the OCA 48 may include greater than two output stage switches 56.

The OCA 48 of the presently preferred embodiments is operated with two digital outputs from the DSP 18 where the duty of each digital output may be calculated independently by the DSP 18. Separate interpolation calculations within the DSP 18 may be performed to generate the digital control outputs used to convert uniform sampled data to its continuous equivalent waveform. Accordingly, each switching cycle of the OCA 48 may include four semi-independent switching times each of which may be separately calculated by the DSP 18 to minimize distortion.

For a detailed discussion of the OCA 48, the reader is referred to "Precision DC-to-AC Power Conversion by Optimization of the Output Current Waveform—The Half-bridge Revisited" by G. R. Stanley & K. M. Bradshaw, *IEEE Transactions on Power Electronics*, Vol. 14, No.2, March, 1999.

The OCA 48 is not required to run with any effective dead-time since potentially destructive shoot through currents do not occur. Dead-time is necessary in conventional half-bridge designs to prevent large destructive shoot-through currents. Management of dead-time to minimize distortion, however, inherently minimizes the independence of the switches in conventional half-bridge designs. Control of the OCA 48 by the DSP 18, on the other hand, may concentrate on independent optimization of the PWM waveforms from each of the first and second output stage switches 56.

In the OCA 48, the total duty of the output stage switches 56 may operate at unity, overlapped or underlapped. The "total duty" of the output stage switches 56 is the sum of the duty cycle of each of the output stage switches 56. Accordingly, the sum of the duty cycle of the first and second output stage switches 56 is equal to 100% when the total duty is equal to unity. As used herein, the term "overlap" or "overlapped" refers to the operating condition where the total duty of the first and second output stage switches 56 is greater than unity. Anytime the first and second output stage switches 56 are on at the same time, they are said to be overlapped. Similarly, when the total duty of the first and second output stages switches 56 are less than unity they are said to be underlapped. In conventional half bridge designs, an overlapped condition creates potentially destructive shoot through currents, while an underlapped condition creates deadtime.

The OCA 48 may run with 50% duty cycle on each of the first and second output stage switches 56 (unity) at zero-signal quiescent conditions. Increasing the duty cycle of each of the first and second output stage switches 56 above 50% (overlap) results in excess circulating current in the output stage that is not destructive, but instead simply reduces operating efficiency. To maximize efficiency yet still avoid distortion, the OCA 48 may in ideal conditions be run with the total duty cycle for both positive and negative output stage switches 56 equal to unity. Losses in the output stage, however, may result in loss of magnetization in the output inductors, which may in turn result in discontinuous current modes (DCM) of operation of the OCA 48. Distortion resulting from DCM may be considered analogous to the distortion caused by dead-time in a conventional half-bridge design.

Since there is no concern with potentially destructive shoot-through current, however, control by the DSP 18 may strive to have the output stage switches 56 on at the same time (e.g. overlapped) to avoid DCM. Accordingly, distortion generated as a result of DCM may be eliminated by increasing the total duty cycle of the output stage switches 56 to greater than unity (e.g. increasing overlap in the switch duty cycles of each of the output stage switches 56). During operation, when the total duty is greater than (or equal to) unity, the OCA 48 may operate in continuous current mode (CCM). Preferably, the DSP 18 strives to maintain CCM to avoid non-linearity in the output stage by overlapping the duty cycles of the output stage switches 56, while also remaining close to unity to avoid significant overlap resulting in lower efficiency.

In the presently preferred embodiments, when no output signal is desired the OCA 48 may be placed in a sleep mode by the DSP 18 to minimize power consumption by stopping the switching of the output stage switches 56. The OCA 48 may also be placed in a lower loss mode when deliberately underlapped (total duty <100%) at quiescent conditions, the quiescent losses may be greatly reduced by inducing zero voltage switching (ZVS) switching. As known in the art, ZVS is a reduced loss form of switching that occurs when the voltage across a power switch is reduced to zero by a resonant transition just prior to turning on the power switch. In the presently preferred embodiments, ZVS switching may represent an intermediate loss condition to simply stop the switching, thereby placing the OCA 48 in the sleep mode. When "awakened" from the sleep mode by the DSP 18, the OCA 48 does not experience the startup transient or click commonly experienced when one switch must precede the other as in conventional half-bridge class D designs. Accordingly, the DSP 18 may instantly awaken the OCA 48 with control signals on the logic signal lines 58 without dead time ramping or other measures practiced with conventional half-bridge designs.

The output LP filter 50 may receive two PWM outputs from the OCA 48. The output from the output LP filter 50 is the output signal with a voltage of Vout, which may be provided to the transducer 12 on the output signal line 26.

The output LP filter 50 may include demodulation filters to remove most of the PWM spectra from the output signal such that the waveform of Vout is substantially free of visible ripple. As further illustrated in FIG. 2, Vout is also fed back to the DSP 18 on a Vout line 60 for conversion to a digital signal.

The current overload limiter 52 senses the current in the early stages of the output LP filter 50 (the output current from the OCA 48) using voltage feedback sense lines 62. Upon indication of current overload conditions on the output signal line 26 a current overload indication may be provided to the DSP 18 on a current overload line 64.

The load current monitor 54 utilizes a current sensor 66 to monitor the output current (Iout) on the output signal line 26 as illustrated. A signal output from the load current monitor 54 representative of Iout may be provided to the DSP 18 on an Iout line 68. In one embodiment, the signal from the load current monitor 54 may be provided as a digital signal. In another embodiment, the signal is continuous and the DSP 18 performs conversion. The load current monitor 54 may also provide a similar signal (analog or digital) indicative of the output current Iout external to the PWM audio power amplifier 10 with a current monitor line 70.

With respect to the DSP 18 of FIG. 2, the logic component 90 is representative of the signal processing functionality embodied in one or more applications operating within the DSP 18. The functionality includes, for example, signal processing, feed forward control, operational supervision, user interface, etc. The applications may be software or firmware based code downloaded into memory within the DSP 18 for execution during operation.

The functionality of the logic component 90 may include, for example, an LP filter module, an inverse equalization (EQ) module, a compression/limiter module, an input signal processing module, a thermal management module, a sleep mode module, a display module, a power supply supervision module, a computer control and monitoring module, a load supervision module and a clock module. In other embodiments, the functionality of the logic component 90 may include fewer or more modules. Accordingly, the exemplary functionality described should not be construed as m any way limiting.

The LP filter module functionality may limit the input signal bandwidth in the PWM audio power amplifier 10. The bandwidth of the input signal may be limited to avoid driving low input-impedance features of the output LP filter 50 that occur at the first major resonance and higher-frequency modes. Accordingly, the construction of any band-limiting filters within the PWM audio power amplifier 10 may be very accurate and cost-effective since tight tolerance capacitors are unnecessary. In addition, the LP filter module may perform band limiting to prevent aliasing of high-frequency signals during conversion by the DSP 18 from a continuous input signal to a digital record.

The inverse EQ module may correct for response deviations away from a desirable flat response in the output LP filter 50 and the closed-loop response. This filtering demand may be combined with the implementation of a band-limiting low-pass input filter within the PWM audio power amplifier 10. The frequency response of the PWM audio power amplifier 10 is a function of the load impedance and the interaction of the load impedance with the output impedance formed by the output LP filter 50. Accordingly, inverse EQ of the entire amplifier system may be performed to improve frequency response.

Adaptive inverse equalizing by the inverse EQ module may be performed to maximize the response accuracy, such as, for example, by performing equalization for loudspeaker deficiencies. In one embodiment, adaptive inverse equalizing may be based on the output signal voltage Vout that is returned to the DSP 18 on the Vout line 60. In addition, adaptive inverse equalizing may be performed by the inverse EQ module to compensate for response differences vs. load impedance. Response differences vs. load impedance often result from the increased high-frequency amplifier output impedance resulting from inductance within the output LP filter 50. The intrinsic output impedance of the PWM output stage would be relatively low were it not for this inductance.

The functionality of the compressor/limiter module may include moderation of distortion in the output signal formed by amplifier overload conditions. Such overload conditions may be caused by, for example, power supply fluctuations, excessive output voltage Vout and/or excessive output current Iout. The compressor/limiter module may be applied to the signal processing within the DSP 18 to reduce the input signal level when overload conditions are detected. The compressor functionality may be further used to attenuate the signal levels should the output signal of the PWM audio power amplifier 10 be overdriven in either the dimensions of voltage or current.

In the presently preferred embodiments, the compressor/limiter utilizes a control window acting as a decision window for the input signal. When the compression/limiter is not invoked, the control window may be set beyond the threshold of input signals to the PWM audio power amplifier 10. When the compression limiter is invoked, the control window may be made smaller thereby lowering the thresholds of input signals. This type of control may minimize audible consequences of overload conditions and may also reduce the need to abort all operation to rectify overload conditions.

The input signal processing module functionality includes well-known processes such as crossovers, parametric equalization, tone controls, time delays, signal gating, all-pass filters and feedback suppression methods. In some embodiments, such functionality may be capable of adjustment/control of a user of the PWM audio power amplifier 10.

The thermal management module of one embodiment may include, temperature monitoring of the power supply 14, the OCA 48 and/or the transducer 12. Temperature monitoring of the transducer 12 may involve, for example, thermal protection of loudspeakers by simulation of voice coil temperatures. Temperature monitoring of the OCA 48 and the power supply 14 may involve signals indicative of temperature provided on an OCA temperature sensing line 80 and a power supply (PS) temperature sensing line 82 as illustrated in FIG. 2. Thermal management of the PWM audio power amplifier 10 in the presently preferred embodiment is preferable performed with the compressor/limiter functionality. If, for example, either the power supply 14 or the OCA 48 is overheated, the control window of the compressor/limiter functionality may be contracted to reduce the maximum allowed output signal voltage.

The sleep mode module may represent a power saving mode. In the presently preferred embodiments, after a predetermined time period has expired, as identified by, for example a count down timer, or elapse timer, the PWM audio power amplifier 10 is placed in a sleep mode. Timing to enter the sleep mode may be based on quiescent conditions of the PWM audio power amplifier 10, such as, for example, absence of an input signal. Upon entry into the sleep mode, the PWM audio power amplifier 10 may be placed in a reduced power consumption state.

The display module may include drivers and other necessary applications to generate signals indicative of operation that are capable of driving a display device. In addition, the functionality of the display module may include capability to receive and process signal inputs to direct the operation of the DSP 18 and/or provide indications thereto. Exemplary display devices include light emitting diode(s) (LED), a screen display, a touch screen, audio devices or any other sensory related mechanism capable of conveying and receiving information. Information indicative of operation provided by the DSP 18 may include, for example, power on indication, input/output signal indications, overload indications and/or overheating indications. In addition, information such as, for example, configuration data, mode and/or gain settings, real-time analyzers, display of the output VI plane, VU meters and any other operational related information may also be provided.

The power supply supervision module may include load management, temperature management, overcurrent management, noise management and/or management of any other operational variables related to the power supply 14. Monitoring and control of the power supply 14 with power supply supervision module may be used to implement such management functionality. Accordingly, signal inputs to the DSP 18, as well as control outputs from the DSP 18 to the power supply 14, may be transmitted over power supply supervision lines 84 by the power supply supervision module. In one embodiment, supervision of possible environmental abuses of the power supply 14 may be performed by the DSP 18. For example, extremes of voltage (surges) can threaten the viability of the power supply 14 while losses of power and brownouts may interrupt operation or create system thumps and other transients.

The DSP 18 may monitor for such conditions and, where possible, perform adaptive protective measures to the input signal to avoid such undesirable conditions. The adaptive protective measure may be performed to avoid detrimental impact when conditions, such as, for example, unstable line voltages, indicate extraneous low-frequency signals may be forthcoming on the input signal. In one embodiment, protective measures may include the selective addition of high pass filtering in the input signal path, such as, for example, a high-pass band-limiting filter to protect driver displacement of a loud speaker. The high pass filtering may include a cutoff frequency that is above the frequency range of expected input signals. In another embodiment, the adaptive protective measures may include the use of attenuation to reduce the amplitude of the input signal without appreciable distortion during, for example, unstable line voltages The supervision of stress levels of the power supply 14 may also be included in the power supply supervision module of one embodiment. Stress level supervision may provide additional protection beyond that provided by simple internal current limiters and thermal cut-outs within the power supply 14. If stress levels are suggestive of product failure or risk thereof, the DSP 18 may abort operation of the power supply 14 with a control output. In addition, the DSP 18 may request operator intervention while giving diagnostic information to displays and/or over the network connection 30.

The computer control and monitoring module may include functionality to communicate via the network connection 30 with a remote device, such as, for example, a computer, a server, a personal digital assistant (PDA), a pager, a wireless phone or any other network compatible device capable of receiving and/or sending information over a network. Accordingly, operational and performance parameters of the PWM audio power amplifier 10 may be dynamically provided in real-time and/or in a datafile over a network. Similarly, the operation of the PWM audio power amplifier 10 may be dynamically controlled via instructions received and processed by the computer control and monitoring module.

The load supervision module may include load protection and load linearity correction. In the presently preferred embodiments, the load is a loudspeaker. In other embodiments, supervision of any other loads driven by the PWM audio power amplifier 10 may be supervised by the load supervision module. Load protection may include computing load impedance (Z), such as, for example, loudspeaker impedance, using arbitrary signals and Fourier methods by simultaneously sampling the output current (Iout) and the output voltage (Vout) of the PWM audio power amplifier 10.

In addition, the thermal protection of loads, such as, for example, loudspeakers, may be performed by estimating driver operating temperatures. In one embodiment, computation of the loudspeaker's input power with a sampling rate that supports the Nyquist sampling limits of the output signal is unnecessary. Instead, average power may be computed to sufficient accuracy with sampling at substantially lower rates so long as the rates are sufficiently faster than the shortest time constant of the equivalent thermal impedance of the driver.

Once the operating temperature of a driver's voice coil is known, it may be possible to administer corrections to the frequency response to correct for the response changes that derive from higher electrical resistance. As such, subsequent losses of several dB of sensitivity may be avoided in, for example, high temperature voice coil designs where resistance may be doubled from cold to hot operation. Well known techniques may be used by the DSP 18 to minimize displacement related driver damage using the load supervision module.

Linearity correction of loads, such as, for example, loudspeaker drivers may involve the correction of non-linear effects within the load through approximation of non-linear effects with the load supervision module. For example, the errors in linearity that derive from a loudspeaker's magnetic design, acoustic structure and/or suspension may be corrected. Correcting loudspeaker non-linearity may allow higher acoustic output power systems to be constructed. In addition, traditional loudspeaker motor designs compromise efficiency to obtain linearity. Correcting linearity external to the loudspeaker with the load supervision module may allow the motor designs to focus on efficiency.

The clock module may include the master clock timing as well as any other timing functions needed within the PWM audio power amplifier 10. The master clock timing may define the operating frequency of all the subsystems. Timing by the master clock timing may be provided, for example, with a crystal to provide accuracy and low jitter. In addition, the DPS 18 may also include functionality to obtain the master clock frequency externally from any other timing source, such as, for example, another DSP 18 via the network connection 30.

In FIG. 2, the ADC 92 within the DSP 18 may include at least one analog to digital converter to sample continuous input signal(s) and convert such signals to a digital record for further processing. In other embodiments, the ADC 92 may be external to the DSP 18. In still other embodiments where the input signal is digital, the ADC 92 may be omitted.

The linearity component 94 may include interpolators, linearizers, quantizers and noise shapers to manage, shape and otherwise minimize discernable differences in continuous signals that have been digitally sampled. Such minimization may also include feed forward control to approximate non-linear affects within the output stage of the PWM audio power amplifier 10. Computation of non-linear affects may also involve consideration of state parameters of the PWM audio power amplifier 10, such as, for example, power supply voltages, output voltage (Vout), output current (Iout), switch duty of the OCA 48, gate drive conditions, semiconductor device temperatures, etc. The state parameters may be considered by the DSP 18 within the linearity component 94 to reduce distortion.

The fast ADCs 96 may quickly and accurately translate continuous signals provided by the power supply 14 and the power DAC 16. In the illustrated embodiment, the fast ADCs 96 may translate the +Vcc and −Vcc control voltages from the power supply 14, as well as the output currents of the OCA 48. The output currents of the OCA 48 may be provided by current sensors 86 on OCA current lines 88. In other embodiments, the output currents of the OCA 48 may be sensed in any other location between the OCA 48 and the transducer 12 using current sensors or any other current sensing technique.

The +Vcc and −Vcc control voltages may be provided to the fast ADCs 96 on control voltage lines 89. In other embodiments, any other continuous signals indicative of the operation of the PWM audio power amplifier 10 may be translated by the ADCs 96. Due to latency issues, sensing by the current sensors 86 and translation by the fast ADCs 96 may be designed to support a substantially high frequency sample rate to bound high frequency output distortion. Preferably, the rate of data conversion is equal to the operating frequency of the power DAC 16. Lower rates may be used; however, when conversion rates lag the time varying signals that are being processed the ability to make the linearity corrections may be affected. The translated continuous signals may be utilized by the PWM modulator component 98.

The PWM modulator component 98 may provide feed forward control via control signals provided to the gate drivers 46 on the logic signal lines 58. In the presently preferred embodiments, the feed forward control involves open loop gain control and overlap control of the OCA 48.

The open loop gain control may be used to correct output stage gain errors that result from lack of regulation of the Vcc control voltages. When the Vcc control voltages are not of equal magnitude the offset created in the output signal may also be corrected by the DSP 18 by adding an offset to the control signal. In the DSP 18, however, gain control may be implemented as a simple multiplication operation whose coefficient is provided to the DSP 18.

The overlap control is a total duty control that preferably performs both static and dynamic bias adjustment of the switching duty of the OCA 48. In the presently preferred embodiments, the overlap control may use the output currents of the OCA 48 as the input variable to control switching duty. Output currents of the OCA 48 that have been converted by the fast ADCs 96 may be made available to the PWM modulator component 98 for the overlap control. The overlap control may compensate for losses in the output stage, such as, for example, effective loss of magnetization, based on the output currents of the OCA 48.

In other embodiments, high-frequency sensing of the output voltage Vout may also be considered as part of the overlap control. In this embodiment, the output voltage Vout may be supplied to PWM modulator component 98 via the output voltage line 60 and the fast ADCs 96. In other embodiments voltage indicative of output voltage Vout may sensed from any other location within the power DAC 16. In one embodiment, differentiated output voltage information (dVout/dt) may be used to augment the loss information provided by output current information of the OCA 48.

The dVout/dt information is directly related to the capacitor charging current at the output of the output LP filter 50. As such, capacitor charging current information at the output of the output LP filter 50 may augment the loss information by providing additional information related to circulating currents inside the output LP filter 50, as well as losses within the OCA 48. Accordingly, the Vout voltage may be used by the PWM modulator component 98 to increase the accuracy in the determination of the losses in the output stage. In other embodiments, losses within the output LP filter 50 and/or the OCA 48 may be determined by sensing input and outputs voltages of the output LP filter 50 and/or the OCA 48 directly, or any other similar technique.

In still other embodiments, the overlap control may also consider the switch duty cycle of each the output stage switches 58 of the OCA 48. Output stage switch duty sensing may be performed by the DSP 18. The differentiated switch duty cycle (dD/dt) may similarly be used to augment the effective loss information provided by the output currents of the OCA 48. The dD/dt may provide information related to the losses in the output LP filter 50 and the OCA 48. The differentiated switch duty cycle (dD/dt) may be multiplied by the total power supply voltage of the Vcc control voltages to equal the dV/dt at the input to the output LP filter 50. This technique differs from the derivative of output voltage Vout by the inverse of the response of the output LP filter 50. In other embodiments other techniques for determining losses in the output LP filter 50 and the OCA 48 may be utilized.

The bias adjustment may be performed by the overlap control by shifting the effective DC baseline of separately computed modulating triangle waveforms functionally generated by the PWM modulator component 98. Digitized input signals processed through the linearity component 94 may be digitally modulated onto the triangle waveforms with N=2 PWM modulation by the PWM modulator component 98 to form the control signals. The control signals may be provided as first and second control signals to the first and second gate drivers 46, respectively, on the logic signal lines 58 as previously discussed.

Voltage fluctuations of the power supply 14 which alter the bias conditions may also be compensated with the overlap control. Since values of the Vcc control voltages may affect the timing of the power stage, the DSP 18 may, for example, reduce overlap of the output stage switches 56 when the Vcc control voltages increase, and increase overlap as the Vcc control voltages decrease. In one embodiment, compensation for voltage fluctuations may involve the use of a divider in the control loop to adjust the open loop control. In another embodiment, compensation for voltage fluctuations may involve multiplication of the computed modulating triangle waveforms. Both embodiments arrive at the same PWM result of dividing the resultant pulse width. Division of the effective pulse width modulation by the voltage of the Vcc control voltages may eliminate supply sensitivities of the otherwise open-loop configuration of the PWM audio power amplifier 10. This feed-forward technique is sometimes viewed as a feedback technique to the extent that lack of regulation in the Vcc control voltages is a consequence of amplifier output current.

To avoid large amounts of distortion and supply ripple in the output signal, the measurement of the Vcc control voltages and computation by the DSP 18 is preferably executed at high frequency to optimize the feed forward control. Accordingly, the speed and accuracy of the fast ADCs 96 in providing the Vcc control voltages to the PWM modulator component 98 is also preferably performed with high frequency. In addition, the DSP 18 preferably includes sufficient bandwidth to perform high frequency review of the power stage response based on monitoring of the Vcc control voltages.

The PWM modulator component 98 may also assist in overload management. In the presently preferred embodiments, the PWM modulator component 98 may detect potential overload conditions based on the input signal and/or the current overload indication provided by the current overload limiter 52 on the current overload line 64. When an overload condition is detected, the output signal may be clamped by the PWM modulator component 98. Clamping may involve simply limiting the output signal with cycle-by-cycle disabling of the control signals provided to the gate drivers 46. Alternatively, the DSP 18 may invoke the previously discussed compressor/limiter functionality to address the overload condition.

The PWM audio power amplifier 10 illustrated in FIG. 2 uses the DSP 18 in a feed forward fully digital design to drive the power DAC 16. The interleaved design of the OCA 48 may be controlled by digital control outputs of the DSP 18 to advantageously minimize distortion. In addition, through feed forward optimization of the overlap control, power efficiency may be maximized. Further, the control outputs of the DSP 18 may be independently calculated to optimize conversion of the digitally sampled data to an amplified continuous equivalent waveform. Accordingly, the PWM audio power amplifier 10 is capable of supporting high fidelity applications with a high performance low-noise and low-distortion result.

Figure 3:
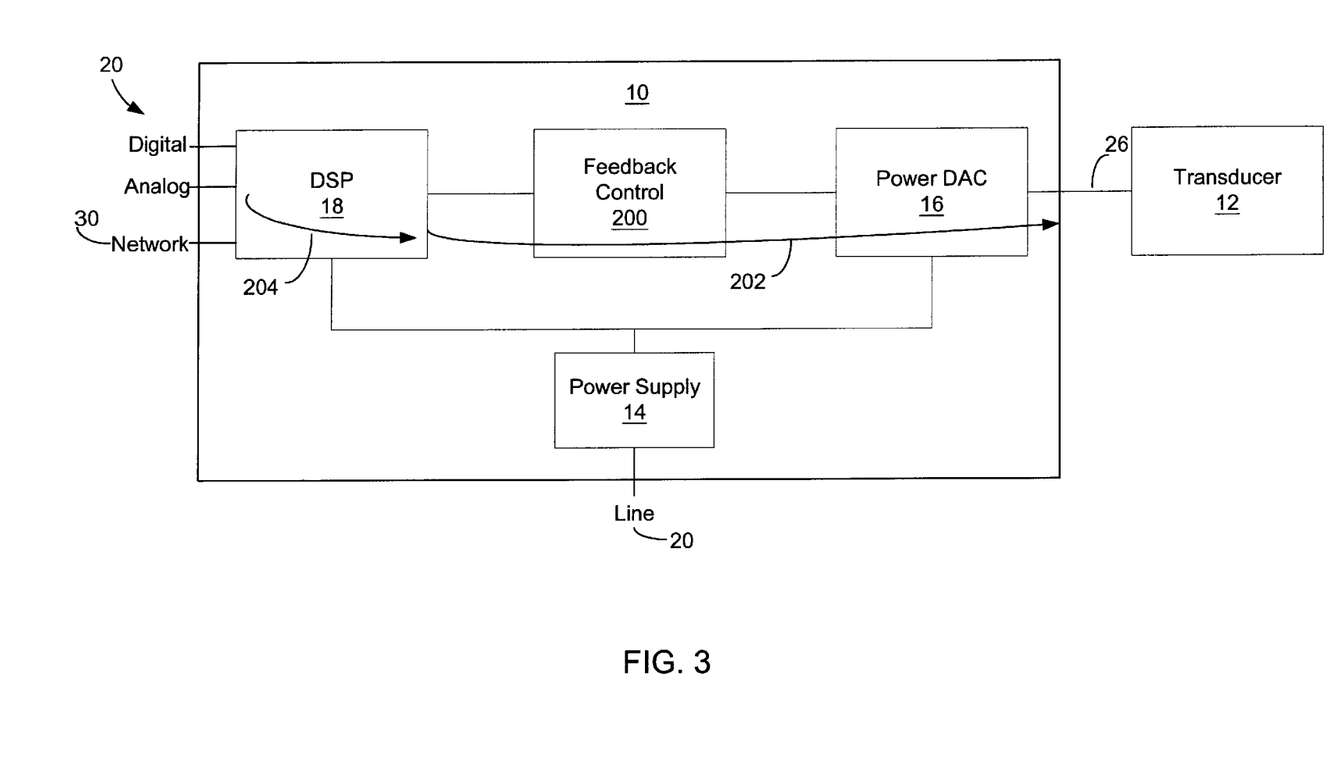
FIG. 3 is a block diagram of another embodiment of a PWM audio power amplifier electrically coupled with a transducer.

FIG. 3 is a block diagram of another embodiment of the PWM audio power amplifier 10 electrically coupled with the transducer 12. The PWM audio power amplifier 10 includes the power supply 14, the power DAC 16, the DSP 18 and a feedback control circuit 200 electrically coupled as illustrated. The power supply 16 and the power DAC 16 are similar to the previously described embodiments unless otherwise described. The functionality of the DSP 18 is similar in some respects and different in others to accommodate operational cooperation with the feedback control circuit 200.

Figure 4:
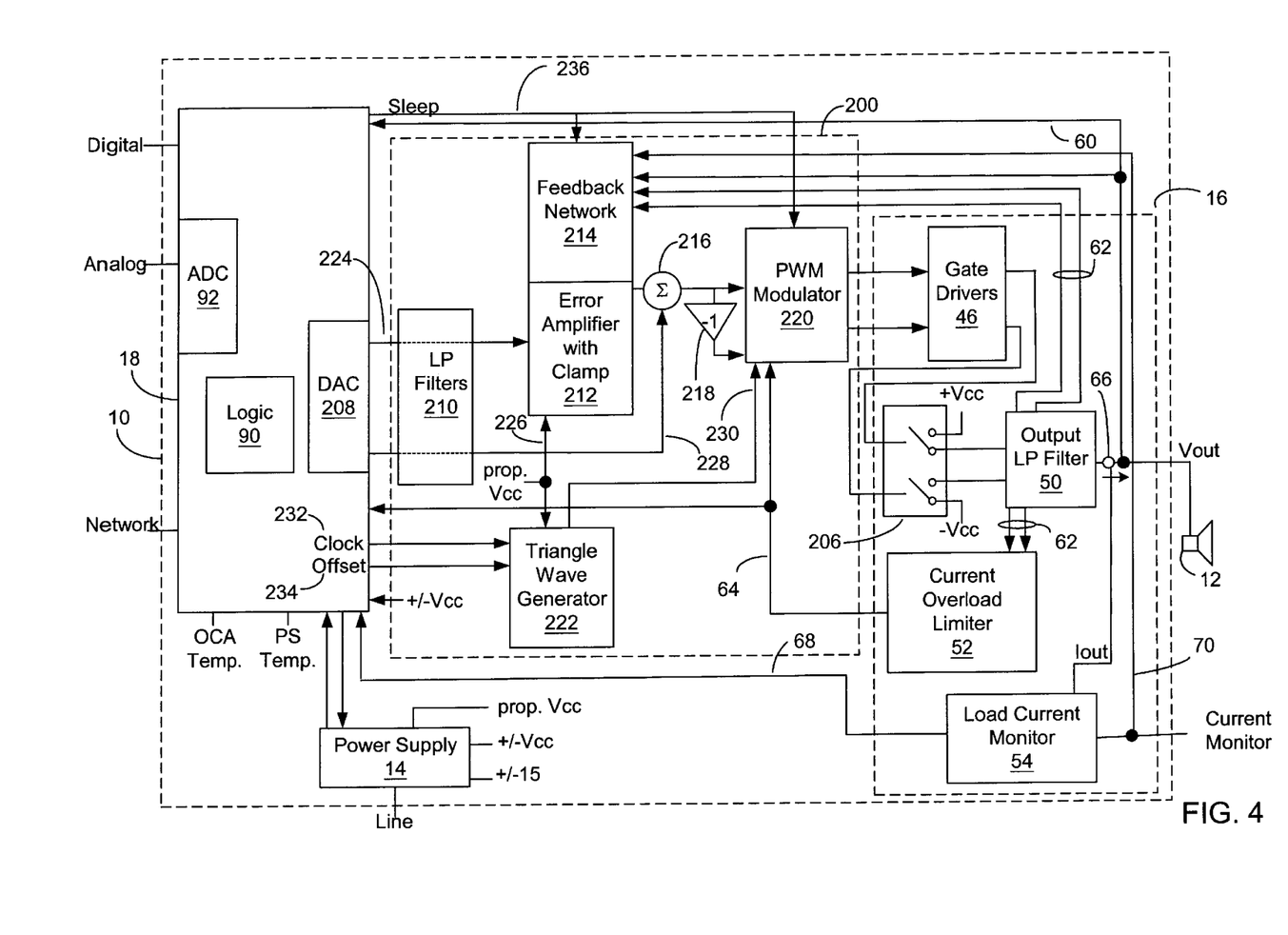
FIG. 4 is an expanded block diagram of one embodiment of the PWM audio power amplifier illustrated in FIG. 3.

The feedback control circuit 200 may provide analog based processing and feedback control within the PWM audio power amplifier 10 along an analog path as illustrated by arrow 202. In addition, the DSP 18 may provide digital signal processing and feed forward control along a digital path as illustrated by arrow 204. Accordingly, the PWM audio power amplifier 10 of FIG. 4 represents a hybrid design including digital processing within the DSP 18 and analog processing within the feedback control circuit 200 and the power DAC 16. The PWM audio power amplifier 10 of this embodiment advantageously utilizes the computational logic based processing strengths of the digital domain and the low latency feedback strengths of the analog domain to minimize distortion and optimize high fidelity performance.

In general, in the feedback control circuit 200 of this embodiment, errors may be corrected by noting differences between the desired controlling input signal provided on the input signal line 20 and the observed output signal on the output signal line 26. As errors are observed, the feedback control circuit 200 may act in a self-convergent manner (stability) to minimize those errors. Corrections are driven by error and thus there may always be some remaining error in the output signal as the magnitude of feedback error correction is bounded by stability limitations. The DSP 18 may estimate a dominant error signal and inject a feed forward error signal into the feedback control. Accordingly, the net error that remains to be corrected by the feedback control circuit 200 may be reduced. In other words, the open-loop performance of the power DAC 16 (before-feedback) may be improved by the feed forward error correction provided by the DSP 18, and thus the net distortion result may be minimized.

FIG. 4 is a more detailed block diagram of the PWM audio power amplifier 10 illustrated in FIG. 3 that includes the power supply 14, the power DAC 16, the DSP 18 and the feedback control circuit 200. As in the previous embodiments, the power DAC 16 includes the gate drivers 46, the output LP filter 50, the current overload limiter 52 and the load current monitor 54 along with a switch mode power converter 206 electrically coupled as illustrated. The switch mode power converter 206 of some embodiments may be the previously discussed opposed current amplifier (OCA) 48 (FIG. 2). In other embodiments, the switch mode power converter 206 may be a conventional half bridge power converter or any other form of switch mode power device.

The illustrated DSP 18 includes the logic component 90, the ADC component 92 and a digital to analog converter (DAC) component 208. The feedback control circuit 200 of the illustrated embodiment includes LP filters 210, an error amplifier with clamping ability 212, a feedback network 214, a summer 216, an inverter 218, a PWM modulator 220 and a triangle wave generator 222. For purposes of brevity, the remaining discussion will focus on differences with the previous embodiments.

The DAC component 208 may translate input signals that have been digitally processed with the logic component 90 to generate digitally processed input signals in a continuous analog form. Digital processing by the DSP 18 may include linearizing the uniformly sampled input signal. The digitally processed input signals may be provided in analog form on a DSP output line 224 to the LP filters 210 for filtering to remove fixed time sample components. In addition, the LP filters 210 may interpolate the digitally processed input signals. The quantization and noise shaping performed by the linearity component 94 of the embodiments discussed with reference to FIG. 2 may be avoided in this embodiment due to processing of the input signal in the analog instead of the digital domain. Following filtering, the signal may be received by the error amplifier 212 for further modification including frequency dependent gain and phase response optimization to maximize the negative feedback.

The feedback network 214 may provide error correction based on analysis of state parameters to linearize the output signal. In the illustrated embodiment, the state parameters include the output current (Iout) from the current monitor line 70, Vout from the Vout line 60, and the current in the early stages of the output LP filter 50 (the output currents of the switch mode power converter 206) from the voltage feedback sense lines 62. In this embodiment, the Vout line 60 provides remote sense voltage feedback and the voltage feedback sense lines 62 provide fast local voltage feedback. In other embodiments, any other state parameters may be included as inputs to the feedback network 214. Based on the state parameters and the input signal, the feedback network 214 may develop an output signal error to linearize the output signal with respect to the input signal. The output signal error may be applied by the error amplifier 212 to the digitally processed input signals provided by the DSP 18.

The error amplifier 212 also receives a proportional Vcc signal on a proportional to Vcc line 226. The proportional Vcc signal is indicative of variations in Vcc control voltages and may be used to adjust the gain of the PWM modulator 220 with feed forward control. Adjustment to the gain of the PWM modulator 220 is preferably accomplished by scaling the amplitude of the triangle wave with the proportional Vcc signal provided on the proportional to Vcc line 226. To maintain optimal feedback control, the gain preferably rises when the Vcc voltages fall and falls when the Vcc voltages rise. In addition, the error amplifier 212 also includes clamping capability. The clamping capability may be adjusted to a predetermined threshold based on the allowable output voltage of the error amplifier 212. Upon exceeding the threshold, the clamp may be activated to not allow production of higher voltages. The predetermined threshold may also be made proportional to the Vcc control voltages using the proportional Vcc signal.

The error amplifier 212 generates an error amplifier output signal based on the digitally processed input signal, the gain and the output signal error. The error amplifier output signal is provided to the summer 216 on an error amplifier signal line 226. In addition, a feed forward error correction signal may be supplied to the summer 216 by the DSP 18 via the LP filters 210 on an error correction line 228.

The feed forward error correction signal may be provided by the DSP 18 to further linearize the output signal by adjusting the output signal error. Accordingly, in these embodiments, part of a linearization term may be provided by the feed forward error correction signal and part may be provided by the output signal error. The DSP 18 may determine the feed forward error signal based on estimation of the dominant error signal.

Estimation of the dominant error signal may be based on approximately modeling the non-linear nature of the PWM audio power amplifier 10 of FIGS. 3 and 4 using a Hammerstein model configuration. In the Hammerstein configuration the PWM audio power amplifier 10 may be modeled as a simple cascade of two subsystems with a non-linear memory-less block receiving the input and outputting to a linear system block containing memory.

In this model the non-linear block may have a unique value of output voltage for each input, i.e. this function may be single valued in its output. The input may be a vector composed of input demand voltage (input signal) and output current(s) representative of the output currents of the switch mode power converter 206 (the input currents to the output LP filter 50 provided on the voltage feedback sense lines 62). At low frequencies the input and output currents of the output LP filter 50 may be identical. As frequency increases, differences may develop due to the growth of capacitor charging currents within the output LP filter 50.

In another embodiment, direct probing of the input currents to observe the internal currents of the output LP filter 50 may be avoided by measuring the output voltage Vout. In this embodiment, the input currents to the output LP filter 50 may be computed by:

$$C_{lpf} * dV_{out}/dt + I_{out}.$$  Equation 1

Where $C_{lpf}$ may represent the sum of the internal capacitances in the output LP filter 50, $dV_{out}/dt$ may be the differentiated output voltage Vout and $I_{out}$ may be the output current Iout being measured with the sensor 66.

The feed forward error correction signal generated by the DSP 18 may be represented by an error surface whose center at Vo=0 and Io=0 is taken to be zero. In other words, at small signal conditions no feed-forward error correction signal may be produced and thus there will be no effect on the open-loop noise. In this case, the overall noise will be the noise of the closed-loop feedback noise suppressed analog portion. The value of Vo may be based on the relative position of the intended output voltage Vout with respect to the control voltage boundaries +/−Vcc, i.e. Vo is understood to range from about +1 to −1 at +Vcc and −Vcc, respectively. Signals proportional to the Vcc control voltages may be derived to place the output voltage Vout in perspective to the substantially non-regulated control voltages Vcc.

In one embodiment, the value of the error (surface) may be computed by the DSP 18 using monitored values of the output signal and the control voltages Vcc. As previously discussed, monitored values Vout and the Iout may be provided to the DSP 18 on the Vout line 60 and the Iout line 68, respectively. In addition, the Vcc control voltages may be provided by the power supply 14 as illustrated in FIG. 4 to develop signals proportional to the Vcc control voltages.

In another embodiment, the values may be derived from a lookup table. The lookup table may be stored in the DSP 18, a local storage mechanism or accessible by the DSP 18 via the network connection 30.

If the power stage is implemented with good matching of the positive and negative switch characteristics, the error surface may be skewed symmetrically about the origin. As such, for each point in the first quadrant, there may be a corresponding mirror image point of identical magnitude and opposite polarity error in the third quadrant. Similarly, for the second quadrant there may be a mirror image point in the fourth quadrant. This symmetry may effectively halve the size of a lookup table.

Due to model-to-model variations, a lookup table or a computing algorithm's coefficients may include capability for updating. For example, variations between vendors of MOSFETs, changes to cell design over time and/or different transducers 12 may make modification desirable. In one embodiment, the updating capability may allow individualization of the error corrections for each PWM audio power amplifier 10.

Mapping of the error surface of the PWM audio power amplifier 10 may be derived by, for example, direct measurement of the output stage and circuit simulation. Direct measurement of the output stage may include multiple simultaneous measurements. Where the PWM audio power amplifier 10 being tested uses substantial low-frequency feedback to control the output voltage Vout, the output voltage Vout and output current Iout may be programmed to be at any point on the VI plane if a large bipolar power supply is placed in series with a desired value of load resistance.

The PWM audio power amplifier 10 under test and the power supply may then be simultaneously activated for about a millisecond (pulsed). The programmed difference in output voltage divided by the load resistance may provide the desired test current. The power supply voltages as well as the output voltage and current may be measured. The voltage measured on the error amplifier signal line 226 at the output of the error amplifier 212 may now include the sum of the error voltage needed and the expected linear term of input. By subtracting the expected linear term of input from the measurement, the value of the error surface for the respective power stage condition may be derived.

In embodiments where a lookup table is utilized, the measured error plane values may be stored in the lookup table. In embodiments utilizing an algorithmic approach to computing the error surface, a regression analysis may be used by the DSP 18 to logically follow the measurements and identify the most accurate coefficients for the chosen error functions.

In FIG. 4, the summation of the feed forward error correction signal from the DSP 18 and the error amplifier output signal are provided as a first input to the PWM modulator 220. In addition, the summation may be inverted by the inverter 218 and provided as a second input to the PWM modulator 220 as illustrated. The injection of the feed forward error into the interior of the closed loop control effectively lowers the net error by improving the open loop performance of the power DAC 16. In this embodiment, the inputs to the PWM modulator 220 are continuous signals developed in the analog domain. Accordingly, the frequency of operation of the feedback control circuit 200 may support the operating frequency of the power DAC 16 and provide capability to bound high frequency output distortion.

The PWM modulator 220 may modulate the two inputs onto a triangle waveform provided on a triangle waveform line 230. The control outputs from the PWM modulator 220 may drive the switch mode power converter 206 via the gate drivers 46 as in the previous embodiments. The PWM modulator 220 may detect potential overload conditions based on the current overload indication provided on the current overload line 64 from the current overload limiter 52. In response to the overload indication, the PWM modulator 220 may implement some form of overload reduction and/or cycle-by-cycle limiting technique to reduce the overload condition. As illustrated in FIG. 4, the current overload line 64 may also provide the current overload indication to the DSP 18 such that the DSP 18 may implement the compression/limiter functionality as previously discussed.

The triangle waveform may be generated by the triangle wave generator 222 based on a clock signal received on a clock line 232 from the DSP 18.

In embodiments where the switch mode power converter 206 is the previously described OCA 48 (FIG. 2), the DSP 18 may perform overlap control. The overlap control may be performed similarly to the previous embodiments by adjusting the effective DC baseline voltage of the triangle waveform. In this embodiment, however, the data sampling and processing rates within the DSP 18 of the output currents of the switch mode power converter 206 and/or the voltage output Vout may be substantially lower in the overlap control. In the presently preferred embodiments the sampling and processing rates may be similar in frequency to the audio bandwidth of the input signal.

Although relatively high rates of data sampling and processing may improve fidelity, the rates by the DSP 18 may be substantially lower than the previous embodiments since the feedback control circuit 200 may perform high frequency error correction of the time varying output signals. Accordingly, linearization of the output signal by the feedback control circuit 200 with the signal output error may occur at a substantially higher frequency than changes in the feed forward error correction signal provided by the DSP 18. Since the feed forward error correction signal is injected into the feedback control loop to adjust the output signal error, the remaining error not minimized by the output signal error may be further reduced with the feed forward error correction signal without compromising stability in the negative feedback control.

Since one triangle waveform is generated by the triangle wave generator 222, the DSP 18 may calculate one offset signal. The offset signal may be converted to analog and provided to the triangle wave generator 222 on an offset line 234.

The observation of the Vcc control voltages in this embodiment may also occur at lower frequency than in the previous embodiments discussed with reference to FIGS. 1 and 2. Accordingly, an analog to digital converter (ADC) within the DSP 18 (not shown) to digitize the Vcc control voltages may be of lower frequency and accuracy than the fast ADCs 96 in the DSP 18 of FIG. 2. For example, multiplexing of a relatively low speed converter to monitor the Vcc control voltages may produce a high-performance low-noise and low-distortion result. The lower speed and accuracy requirements in compensating for the Vcc control voltage in this embodiment are similarly due to the high frequency feedback control provided by the feedback control circuit 200.

Generation of the triangle wave form may also be adjusted at a higher frequency based on the proportional Vcc signal provided on the proportional to Vcc line 226 from the power supply 14. As in the previous embodiments, the effect of variations in the Vcc control voltages may affect the proper timing of output stage. Accordingly, the proportional Vcc signal may be utilized in the overlap control to compensate for such fluctuations by increasing overlap as the Vcc control voltages increase and decreasing overlap as the Vcc control voltages decrease.

In other embodiments where the switch mode power converter 206 is the OCA 48 (FIG. 2), non-linear corrections may also be performed with the DSP 18 using the overlap control. Non-linear corrections may be desirable where the optimum correction for overlap is not an exactly linear function of output current. In one embodiment, the non-linear corrections may be computed by the DSP 18 using the state parameters. In another embodiment, the DSP 18 may utilize a lookup table based on inputs derived from the current and voltage information available from the state parameters. In still other embodiments, the control of overlap may be performed with analog circuits external to the DSP 18.

The sleep mode module of this embodiment similarly minimizes power consumption of the DSP 18 during quiescence periods. In embodiments where the switch mode power converter 206 is the OCA 48 previously discussed with reference to FIG. 2, the DSP 18 may also place the switch mode power converter 206 in sleep mode or lower loss mode. In addition, the DSP 18 of this embodiment may also generate a sleep control signal on a sleep line 236. The sleep control signal of the illustrated embodiment controls the sleep mode, and therefore the power consumption, of the feedback network 214 and the power DAC 16. In other embodiments, any other portions of the PWM audio power amplifier 10 may be similarly controlled to optimize power consumption.

This embodiment of the PWM audio power amplifier 10 advantageously combines the computational strengths of the DSP 18 with the high frequency characteristics of the feedback control circuit 200. By introducing feed forward error correction from the DSP 18 into the interior of the feedback control loop of the feedback control circuit 200, the output signal of the PWM audio power amplifier 10 may be substantially linearized.

The embodiments have been discussed with reference to functional blocks identified as modules and components that are not intended to represent discrete structures and may be combined or further sub-divided in various embodiments as known in the art. In addition, while various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A pulse width modulated audio power amplifier, comprising:
   a switch mode power converter operable to produce an amplified output signal as function of an input signal;
   a feedback control circuit electrically coupled with the switch mode power converter, the feedback control circuit operable in the analog domain with negative feedback control to continuously linearize the output signal with an analog output signal error; and
   a digital signal processor electrically coupled with the feedback control circuit, the digital signal processor operable with feed forward control to further linearize the output signal by adjustment of the analog output signal error with a feed forward error correction signal.

2. The pulse width modulated audio power amplifier of claim 1, where the feedback control circuit is operable to generate the output signal error as a function of the voltage and current of the output signal.

3. The pulse width modulated audio power amplifier of claim 1, further comprising a substantially unregulated power supply operable to generate a control voltage (Vcc), where the voltage of the output signal is compensated by the feedback control circuit for fluctuations in the substantially unregulated power supply voltage.

4. The pulse width modulated audio power amplifier of claim 3, where the digital signal processor is operable in the digital domain to selectively perform adaptive protective measures to the input signal in response to supervision of the substantially unregulated power supply.

5. The pulse width modulated audio power amplifier of claim 1, where the digital signal processor is operable to discretely generate the feed forward error correction signal based on estimation of a dominant error signal, the dominant error signal is estimated with the voltage and current of the output signal.

6. The pulse width modulated audio power amplifier of claim 1, where the digital signal processor is operable to perform discrete load protection monitoring as a function of the voltage and current of the output signal.

7. The pulse width modulated audio power amplifier of claim 1, where the digital signal processor is operable to discretely adjust the output signal en-or with the feed forward error correction signal that has been converted from the digital domain to the analog domain.

8. The pulse width modulated audio power amplifier of claim 1, where the switch mode power converter includes art opposed current amplifier.

9. A pulse width modulated audio power amplifier, comprising:
   a feedback control circuit;
   a switch mode power converter electrically coupled with the feedback control circuit, the feedback control circuit operable to continuously drive the switch mode power converter with closed loop analog control to generate an output signal; and
   a digital signal processor electrically coupled with the feedback control circuit, the digital signal processor operable to inject a feed forward error correction signal into the closed loop analog control.

10. The pulse width modulated audio power amplifier of claim 9, where the feedback control circuit is operable to generate an output signal error with analog processing as a function of at least one of output current of the switch mode power converter and the voltage and current of the output signal.

11. The pulse width modulated audio power amplifier of claim 9, where the digital signal processor is operable to digitally estimate the feed forward error correction signal as a function of the voltage and current of the output signal.

12. The pulse width modulated audio power amplifier of claim 9, where closed loop control occurs at a substantially higher frequency than changes in the feed forward error correction signal.

13. The pulse width modulated audio power amplifier of claim 9, where the switch mode power converter comprises a plurality of output stage switches each operable with a duty cycle, where overlap of the duty cycles is variable as a function of an offset signal generated by the digital signal processor.

14. The pulse width modulated audio power amplifier of claim 13, where the digital signal processor is operable to select the amount of overlap as function of the output current of the switch, mode power converter.

15. The pulse width modulated audio power amplifier of claim 14, where the digital signal processor is operable to determine the amount of overlap from a lookup table.

16. The pulse width modulated audio power amplifier of claim 14, where the digital signal processor is operable to sense and differentiate over time the voltage of the output signal, the overlap in duty cycle selectable as a function of the differentiated output voltage.

17. The pulse width modulated audio power amplifier of claim 14, where the digital signal processor is operable to sense and differentiate over time a switch duty of the output stage switches, the overlap in duty cycle selectable as a function of the differentiated switch duty.

18. The pulse width modulated audio power amplifier of claim 14, where the feedback control circuit comprises a triangle wave generator, the triangle wave generator operable to generate a triangle wave signal, the triangle wave signal adjustable by the offset signal to adjust the amount of overlap.

19. A pulse width modulated audio power amplifier, comprising:
   an opposed current amplifier that includes a plurality of output stage switches,
   where the output stage switches ate each operable at a duty cycle in response to respective control signals;
   means for sensing current indicative of the output current of the opposed current amplifier; and
   a digital signal processor coupled with the opposed current amplifier, where overlap in the duty cycle of the output stage switches is discretely selectable by the digital signal processor as a function of the output current.

20. The pulse width modulated audio power amplifier of claim 19, where the output stage switches are operable in response to respective independent digital control signals generated with fully digital feed forward control by the digital signal processor.

21. The pulse width modulated audio power amplifier of claim 19, further comprising a feedback control circuit operable in the analog domain to generate an output signal error, where the digital signal processor is operable to generate a feed forward error correction signal and the output stage switches are each operable in response to control outputs generated as a function of the combination of the output signal error and the feed forward error correction signal.

22. The pulse width modulated audio power amplifier of claim 19, further comprising a lookup table, the lookup table indicative of overlap as a function of the output current.

23. The pulse width modulated audio power amplifier of claim 19, where the digital signal processor is operable to sense and differentiate over time an output voltage (Vout) of the pulse width modulated audio power amplifier, the overlap in dirty cycle also selectable as a function of the differentiated output voltage.

24. The pulse width modulated audio power amplifier of claim 19, where the digital signal processor is operable to sense and differentiate over time a switch duty of the output stage switches, the overlap in duty cycle also selectable as a function of the differentiated switch duty.

25. The pulse width modulated audio power amplifier of claim 19, further comprising a substantially unregulated power supply electrically coupled with the opposed current amplifier and the digital signal processor, where the substantially unregulated power supply is operable to supply a control voltage (Vcc) to the opposed current amplifier and the digital signal processor, the overlap in the duty cycle adjustable by the digital signal processor as a function of fluctuation in the substantially unregulated power supply voltage.

26. A method of minimizing distortion and optimizing fidelity in a pulse width modulated audio power amplifier, the method comprising:
  a) digitally processing an, input signal;
  b) converting the input signal to a continuous waveform;
  c) amplifying the continuous waveform with a switch mode power converter to produce an output signal;
  d) linearizing the output signal with a negative feedback control loop; and
  e) injecting a feed forward error correction signal into the negative feedback control loop to further linearize the output signal.

27. The method of claim 26, where d) comprises generating an output signal error in the analog domain as a function of the voltage and current of the output signal.

28. The method of claim 27, where the voltage of the output signal is compensated as a function of fluctuations in a power supply control voltage.

29. The method of claim 26, where e) comprises generating the feed forward error correction signal with a feed forward control, loop in the digital domain as a function of the voltage and current of the output signal.

30. The method of claim 29, where the voltage of the output signal is compensated as a function of fluctuations in a power supply control voltage.

31. The method of claim 26, where e) comprises generating the feed forward error correction with a digital signal processor in the digital domain.

32. A method of minimizing distortion and optimizing fidelity in a pulse width modulated audio power amplifier, the method comprising:
  a) switching each of a plurality of output stage switches in an opposed current amplifier at a respective duty cycle;
  b) monitoring an output current of the opposed current amplifier; and
  c) discretely adjusting the overlap in the duty cycle of the output stage switches with a digital signal processor as a function of the output current.

33. The method of claim 32, where a) comprises independently generating a digital control signal for each of the output stage switches with the digital signal processor as a function of a fully digital feed forward control.

34. The method of claim 32, where a) comprises generating a control signal for the output stage switches as a function of an analog negative feedback control in combination with a digital feed forward control.

35. The method of claim 34, where the analog feedback control generates an output signal error and the digital feed forward control generates a feed forward error correction signal, the output signal error adjusted by the feed forward error correction signal during generation of the control signals.

36. The method of claim 32, where c) comprises compensating for losses in the pulse width modulated audio power amplifier by adjustment of the overlap.

37. The method of claim 32, where c) comprises:
  differentiating an output voltage of the opposed current amplifier with the digital signal processor; and
  further adjusting the overlap as a function of the differentiated output voltage.

38. The method of claim 32, where c) comprises:
  differentiating a total duty cycle of the opposed current amplifier with the digital signal processor; and
  further adjusting the overlap as a function of the differentiated total duty cycle.

* * * * *